US010288235B1

(12) United States Patent
Chen (10) Patent No.: US 10,288,235 B1
(45) Date of Patent: May 14, 2019

(54) REFRACTIVE DECORATIVE LIGHTING STRING

(71) Applicant: Willis Electric Co., Ltd., Taipei (TW)

(72) Inventor: Johnny Chen, Taipei (TW)

(73) Assignee: Willis Electric Co., Ltd., Taipei (TW)

( * ) Notice: Subject to any disclaimer, the term of this patent is extended or adjusted under 35 U.S.C. 154(b) by 0 days.

(21) Appl. No.: 15/911,809

(22) Filed: Mar. 5, 2018

Related U.S. Application Data (60) Provisional application No. 62/466,547, filed on Mar. 3, 2017, provisional application No. 62/466,646, filed on Mar. 3, 2017.

(51) Int. Cl.
| | |
|---|---|
| *F21S 4/10* | (2016.01) |
| *F21S 4/00* | (2016.01) |
| *H01L 27/15* | (2006.01) |
| *F21V 23/00* | (2015.01) |
| *F21V 19/00* | (2006.01) |
| *F21Y 113/13* | (2016.01) |
| *H01L 33/52* | (2010.01) |
| *F21Y 115/10* | (2016.01) |
| *F21Y 103/10* | (2016.01) |
| *H01L 33/48* | (2010.01) |

(52) U.S. Cl.
CPC ............ *F21S 4/10* (2016.01); *F21V 19/0015* (2013.01); *F21V 23/002* (2013.01); *H01L 27/153* (2013.01); *F21Y 2103/10* (2016.08); *F21Y 2113/13* (2016.08); *F21Y 2115/10* (2016.08); *H01L 33/483* (2013.01); *H01L 33/52* (2013.01)

(58) Field of Classification Search
CPC ...... F21S 4/10; F21V 19/0015; F21V 23/002; H01L 33/52
See application file for complete search history.

(56) References Cited

U.S. PATENT DOCUMENTS

| | | | |
|---|---|---|---|
| 4,761,720 A | 8/1988 | Solow | |
| 4,812,956 A | 3/1989 | Chen | |
| 6,582,094 B2 | 6/2003 | Liu | |
| (Continued) | | | |

FOREIGN PATENT DOCUMENTS

| | | |
|---|---|---|
| CN | 200982547 Y | 11/2007 |
| CN | 201121811 Y | 9/2008 |
| (Continued) | | |

*Primary Examiner* — Evan P Dzierzynski
(74) *Attorney, Agent, or Firm* — Christensen, Fonder, Dardi & Herbert PLLC (57) ABSTRACT

A light string for artificial trees and lighted decorative sculptures. The light string includes a wiring assembly with first and second parallel electrical conductors that extends substantially parallel to said first electrical conductor, electrical insulation comprising polyvinyl chloride that extends along said central axis and encases said first electrical conductor and said second single electrical conductor, and a plurality of light-emitting diode (LED) assemblies encapsulated by a translucent material, each LED assembly including a housing, an LED mounted to the housing, each LED assembly electrically connected to, and mechanically in between, the first conductor and the second conductor so as to exert a lateral force on the first and second conductors thereby causing the first and second conductors to bend in a direction transverse to the central axis.

25 Claims, 7 Drawing Sheets

(56) References Cited

U.S. PATENT DOCUMENTS

| | | | |
|---|---|---|---|
| 6,592,238 B2 | 7/2003 | Cleaver et al. | |
| 6,604,841 B2 | 8/2003 | Liu | |
| 6,914,194 B2 | 7/2005 | Fan | |
| 7,088,904 B2 | 8/2006 | Ryan, Jr. | |
| 7,160,140 B1* | 1/2007 | Mrakovich | F21V 21/002 |
| | | | 439/417 |
| 7,926,978 B2 | 4/2011 | Tsai | |
| 8,397,381 B2 | 3/2013 | Tsai | |
| 8,641,229 B2 | 2/2014 | Li | |
| 9,291,318 B1 | 3/2016 | Benson | |
| 2003/0063463 A1 | 4/2003 | Sloan et al. | |
| 2006/0221609 A1 | 10/2006 | Ryan, Jr. | |
| 2008/0094828 A1 | 4/2008 | Shao | |
| 2011/0228535 A1 | 9/2011 | Shao | |
| 2013/0107514 A1* | 5/2013 | McNabb | F21V 21/00 |
| | | | 362/231 |
| 2016/0341408 A1* | 11/2016 | Altamura | H01L 33/486 |

FOREIGN PATENT DOCUMENTS

| | | |
|---|---|---|
| CN | 201897194 U | 7/2011 |
| CN | 201898147 U | 7/2011 |
| CN | 201966240 U | 9/2011 |
| CN | 202613183 U | 12/2012 |
| CN | 203703878 U | 7/2014 |
| GB | 2 454 546 A | 5/2009 |

\* cited by examiner

FIG. 25

REFRACTIVE DECORATIVE LIGHTING STRING

RELATED APPLICATIONS

This application claims the benefit of U.S. Provisional Patent Application No. 62/466,547, filed Mar. 3, 2017, and of U.S. Provisional Patent Application No. 62/466,646, filed Mar. 3, 2017, both of which are incorporated herein in their entireties.

FIELD OF THE DISCLOSURE

The present disclosure is directed generally to decorative light strings and more specifically to light strings for artificial trees and lighted decorative sculptures.

BACKGROUND OF THE DISCLOSURE

Conventional light strings typically include twisted wire pairs with lighting assemblies (e.g., a socket and bulb arrangement) that extend or face generally radially outward therefrom. The rotational orientation of the lighting assemblies tend to be random. That is, the prominent direction of illumination of the lighting assemblies may be different from one lighting assembly to the next, such that some lighting assemblies face in a direction that is substantially opposite other lighting assemblies. Accordingly, in some applications, various lighting assemblies face in directions that are disfavored (e.g., inward and toward the trunk portion of an artificial tree rather than outward and away from the trunk portion). This can cause a non-uniform appearance in the lighting pattern as visualized from the perspective of a person viewing the light pattern, and give the general appearance that some of the lighting assemblies are substantially dimmer or missing altogether.

A light string that remedies these deficiencies would be welcomed in the decorative lighting arts.

SUMMARY OF THE DISCLOSURE

In various embodiments of the disclosure, lighting assemblies are arranged to illuminate along the axis of the light string, so that the lighting assemblies present a more uniform luminosity when viewed from the side of the string, regardless of the rotational angle from which the string is viewed. Also, in some embodiments, the electrical insulation that dads the electrical conductors that extend between lighting assemblies is translucent, so that some of the light emitted by the lighting assemblies propagates axially along the light string before being scattered, refracted, or reflected radially away from the light string. This produces a unique light effect, wherein the luminous portions of the light string appear to be extended along the axis.

In some embodiments, all of the lighting assemblies are oriented to face in the same radial direction, which can prevent the non-uniform lighting patterns of the prior art. The radially-facing lighting assemblies may be combined with the translucent electrical insulation for a unique light effect.

Structurally, a decorative light string is disclosed, comprising a wiring assembly that includes a first single electrical conductor and a second single electrical conductor that extends substantially parallel to the first single electrical conductor, the first single electrical conductor and the second single electrical conductor being separated and on opposing sides of a central axis that extends in an axial direction. Electrical insulation extends along the central axis and encases the first single electrical conductor and the second single electrical conductor, the electrical insulation separating the first single electrical conductor from the second single electrical conductor in a lateral direction about the central axis. A plurality of apertures are formed along an axial length of the electrical insulation, each one of the plurality of apertures being defined in the axial direction by opposed edges of the electrical insulation and being defined in the lateral direction by opposed portions of the first single electrical conductor and the second single electrical conductor. A plurality of lighting assemblies, each defining an illumination axis about which a luminosity profile is centered when the lighting assemblies are energized, each of the plurality of lighting assemblies being disposed within a respective one of the plurality of apertures, and each being attached to and in electrical communication with the first single electrical conductor and the second single electrical conductor at the respective one of the plurality of apertures, each of the plurality of lighting assemblies extending across the central axis in the lateral direction. A plurality of pottings, each encasing a respective one of the plurality of apertures and an associated one of the plurality of lighting assemblies disposed therein, each of the plurality of pottings bridging the opposed edges of the electrical insulation and the opposed portions of the first single electrical conductor and the second single electrical conductor. Each of the plurality of lighting assemblies may be oriented so that the illumination axis illuminates one of the opposed edges of the electrical insulation, and the electrical insulation and the plurality of pottings are translucent. In some embodiments, the illumination axis is substantially aligned along the central axis.

Each of the electrical insulation may include a web portion that extends laterally between the first single electrical conductor and the second single electrical conductor, the web portion defining a substantially uniform thickness perpendicular to the central axis. In some embodiments, plurality of apertures define a plurality of discontinuous insulation segments. Also, the plurality of pottings may include an epoxy material. In some embodiments, the electrical insulation includes polyvinylchloride.

Each of the plurality of lighting assemblies may include a light emitting diode. In some embodiments, each of the plurality of lighting assemblies includes a control switch configured to control the light emitting diode. Furthermore, each of the plurality of lighting assemblies may include a first metallic terminal, which may be a conductive sheet, that is connected to the first single electrical conductor and a second metallic terminal, or sheet, that is connected to the second single electrical conductor. In some embodiments, each of the plurality of lighting assemblies includes a housing that houses the control switch and the light emitting diode. In some embodiments, the first single electrical conductor and the second single electrical conductor include copper and each have a diameter that is within a range of 0.3 mm to 0.45 mm inclusive.

DETAILED DESCRIPTION OF THE FIGURES

Figure 1:
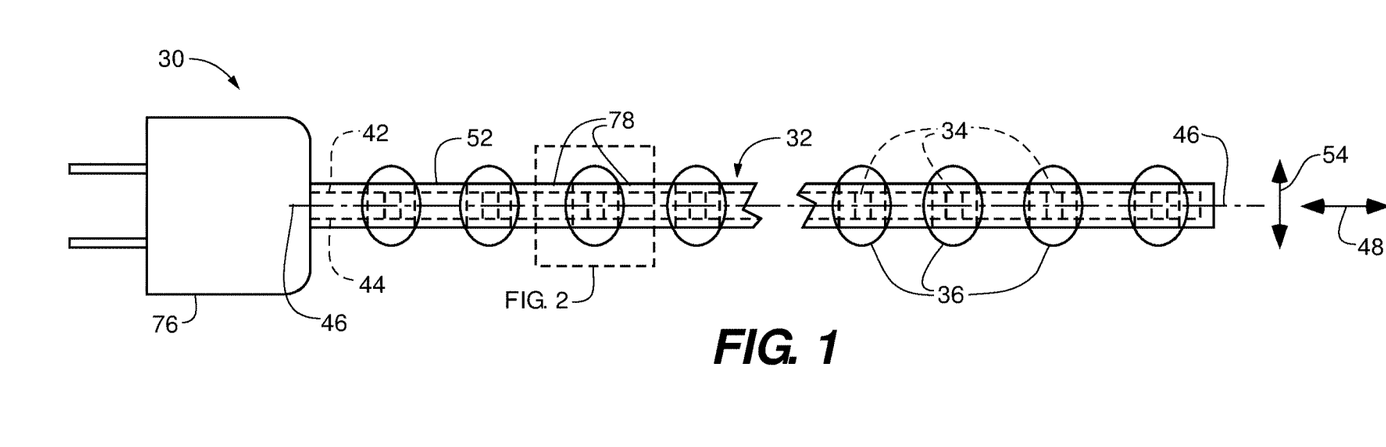
FIG. 1 is a schematic representation of a light string according to embodiments of the disclosure.
Figure 2:
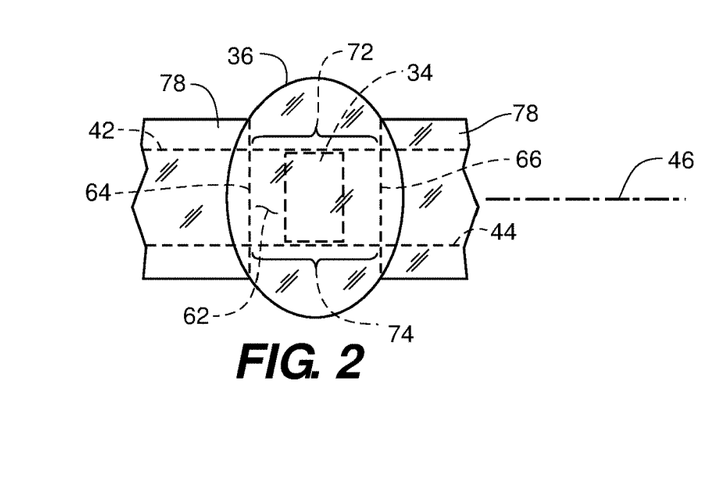
FIG. 2 is an enlarged portion of the schematic representation of FIG. 1.

Referring to FIGS. 1 and 2, a light string 30 is schematically depicted in an embodiment of the disclosure. The light string 30 includes a wiring assembly 32, a plurality of lighting assemblies 34 sourced by the wiring assembly 32, and a plurality of pottings 36. Each of the pottings 36 encase a respective one of the lighting assemblies 34.

The wiring assembly 32 includes a first electrical conductor 42 and a second electrical conductor 44 that extend substantially parallel to each other. Herein, to be "parallel" does not necessarily imply that the conductors 42 and 44 are straight; rather, "parallel" implies that the conductors follow the same route in a side-by-side manner, whether the route is straight or tortuous. The first and second electrical conductors 42 and 44 are separated and on opposing sides of a central axis 46 that extends in an axial direction 48. Electrical insulation 52 extends along the central axis 46, encasing the first and second electrical conductors 42 and 44. The electrical insulation 52 separates the first electrical conductor 42 from the second electrical conductor 44 in a lateral direction 54 about the central axis 46. In various embodiments, the electrical insulation 52 comprises a polyvinylchloride (PVC), which may be translucent, or in other embodiments, may comprise a non-translucent material. In some embodiments, electrical insulation 52 may comprise a colored material that matches an object to which light string 30 is attached, such as green for an artificial Christmas tree, or clear or white for a white-framed outdoor sculpture. An embodiment includes an artificial tree with multiple light sets 30 thereon.

A plurality of apertures 62 are formed along an axial length the electrical insulation 52, each one of the plurality of apertures 62 being bounded in the axial directions 48 by opposed edges 64 and 66 of the electrical insulation 52 (FIG. 2). Each of the plurality of apertures 62 is bounded in the lateral directions 54 by opposed portions 72 and 74 of the first and second electrical conductors 42 and 44 that bridge the respective aperture 62 in the axial direction 48. The wiring assembly 32 may also include a plug or receptacle 76 for ready connection to an electrical source (not depicted).

The plurality of apertures 62 may also define a plurality of discontinuous insulation segments 78, bridged only by the electrical conductors 42 and 44 that pass through the wiring assembly 32 (depicted). Alternatively, the electrical insulation 52 does not form discontinuous insulation segments. For example, the apertures 62 may still have the above-described characteristics of being bounded by edges 64 and 66 and by opposed portions 72 and 74, but with ligaments (not depicted) that are adjacent to and laterally outward of the opposed portions 72 and 74 and that extend in the axial direction 48, so that the lateral edges of the electrical insulation are continuous along the length of the wiring assembly 32.

In some embodiments, the plurality of apertures 62 are formed by stretching the electrical conductors 42 and 44 and electrical insulation 52 along the central axis 46, then cutting slits that pass through or substantially through the electrical insulation 52. Each slit releases the tension in the electrical insulation 52, causing the electrical insulation 52 to return at least partially toward a pre-stretched configuration. The electrical conductors 42 and 44 may be plastically deformed by the stretching, and, upon release of the tension, do not return to the pre-stretched state, at least not to the same extent as the electrical insulation 52. Accordingly, because the insulation 52 rebounds to a pre-stretched state to a greater degree than the electrical conductors 42 and 44, the opposed edges 64 and 66 separate and remain separated to form the aperture 62.

Each of the plurality of lighting assemblies 34 is inserted within a respective one of the plurality of apertures 62 and arranged to bridge and contact both of the opposed portions 72 and 74. Each lighting assembly 34 may then be attached to the first electrical conductor 42 and the second electrical conductor 44 at the opposed portions 72 and 74 that border the respective one of the plurality of apertures 62 to maintain electrical communication between the lighting assembly 34 and the electrical conductors 42 and 44. In some embodiments, each of the plurality of lighting assemblies 34 extends across the central axis 46 in the lateral direction 54.

In some embodiments, the electrical conductors 42 and 44, which extend generally parallel to the central axis 46, are forced laterally outward, away from the central axis 46, by the insertion of the lighting assembly 34, causing the electrical conductors 42 and 44 to bow locally. The local bowing of the conductors 42 and 44 at the opposed portions 72 and 74 are illustrated for the various light strings 30 depicted herein, for example at FIGS. 5, 6, 16, 17, 20, 21, 23, and 24. The local bowing may exert a laterally inward force on the lighting assembly 34 (i.e., toward the central axis 46), which helps retain the lighting assembly 34 within the respective aperture 62 during fabrication of the light string 30.

Each of the plurality of pottings 36 encase a respective one of the plurality of apertures 62 and an associated one of the plurality of lighting assemblies 34 disposed therein. In the depicted embodiment, each of the plurality of pottings 36 bridge the opposed edges 64 and 66 of the electrical insulation 52 and the opposed portions 72 and 74 of the first and second electrical conductors 42 and 44.

In the depicted embodiment, the electrical insulation 52 and the pottings 36 are translucent. The various structural components in FIGS. 1 and 2 that are represented with dashed lines (i.e., the lighting assemblies 34, the first and second electrical conductors 42 and 44, the opposed edges 64 and 66 of the electrical insulation 52) are so depicted to indicate the translucent nature of the covering electrical insulation 52 and the pottings 36.

Optionally, the first and second electrical conductors 42 and 44 may each be single electrical conductors (i.e., each of a single strand rather than a plurality of braided strands). In one non-limiting example, each of the first and second electrical conductors 42 and 44 are approximately 0.37 mm in diameter and include copper or a copper alloy. More generally, in some embodiments, the electrical conductors 42 and 44 are each in a range of 0.36 mm to 0.38 mm inclusive. Herein, a range that is said to be "inclusive" includes the stated end point values of the range as well as all values between the end point values. In some embodiments, the electrical conductors 42 and 44 are each in a range of 0.3 mm to 0.45 mm inclusive. The electrical conductors may be malleable, so that after bending or twisting, the light string 30 assumes the newly bent or twisted shape. The electrical insulation 52 may tend to oppose the malleability of the assembly (that is, impose a certain level of resistance to bending or twisting that can cause the wiring assembly 32 to partially rebound toward its previous shape). To provide a satisfactory level of malleability, the electrical insulation 52 cannot be too thick relative to the diameter of the electrical conductors 42, 44. Accordingly, for an electrical insulation of PVC, the radial thickness of the electrical insulation 52 that dads the electrical conductors 42, 44 is in a range of 0.15 mm to 0.3 mm inclusive. More generally, in some embodiments, a range of the ratio of the radial thickness of the electrical insulation 52 to the diameter of the electrical conductors 42, 44 is in a range of 0.5 to 0.6 inclusive; in some embodiments, in a range of 0.4 to 0.7; in some embodiments, in a range of 0.3 to 1.

Figure 3:
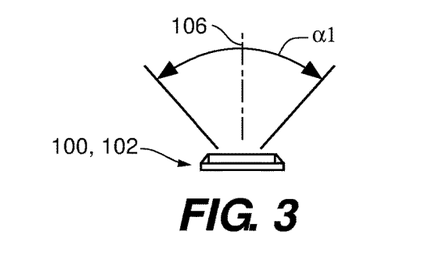
FIG. 3 is a side elevational view of a light emitting diode (LED) light source as used in embodiments of the disclosure.
Figure 4:
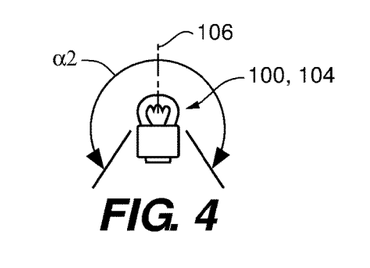
FIG. 4 is a side elevational view of an incandescent light source as used in embodiments of the disclosure.

Referring to FIGS. 3 and 4, lighting elements 100 are depicted for use within the lighting assemblies 62 according to embodiments of the disclosure. In FIG. 3, the lighting element 100 is a light emitting diode (LED) 102, characterized as having a luminosity profile that is emitted substantially within an illumination angle $\alpha 1$. In FIG. 4, the lighting element 100 is an incandescent light bulb 104, characterized as having a luminosity profile that is emitted substantially within an illumination angle $\alpha 2$. While the LED 102 and the incandescent light bulb 104 may have very different luminosity profiles, both illumination angles $\alpha 1$ and $\alpha 2$ may be characterized as being centered about an illumination axis 106. For illustrative purposes, the illumination angles $\alpha 1$ and $\alpha 2$ are depicted as two dimensional. The luminosity profile is generally three-dimensional, and the illumination angles $\alpha 1$ and $\alpha 2$ may vary depending on the rotational orientation about the illumination axis.

Figure 5:
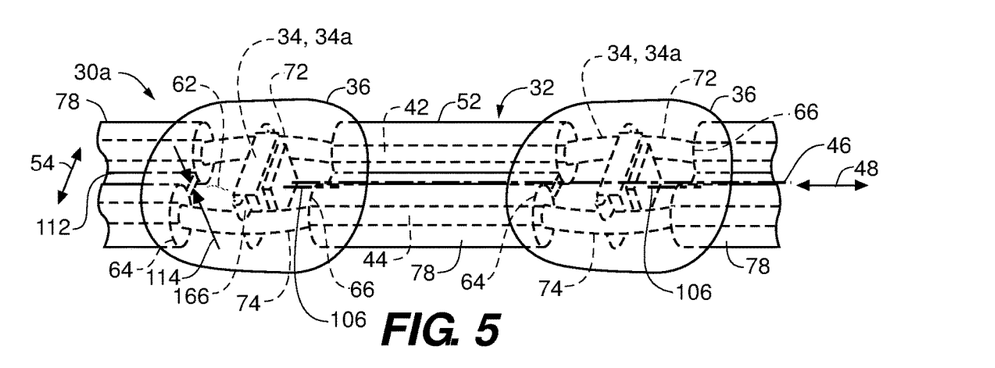
FIG. 5 is a partial perspective view of a light string according to an embodiment of the disclosure.
Figure 6:
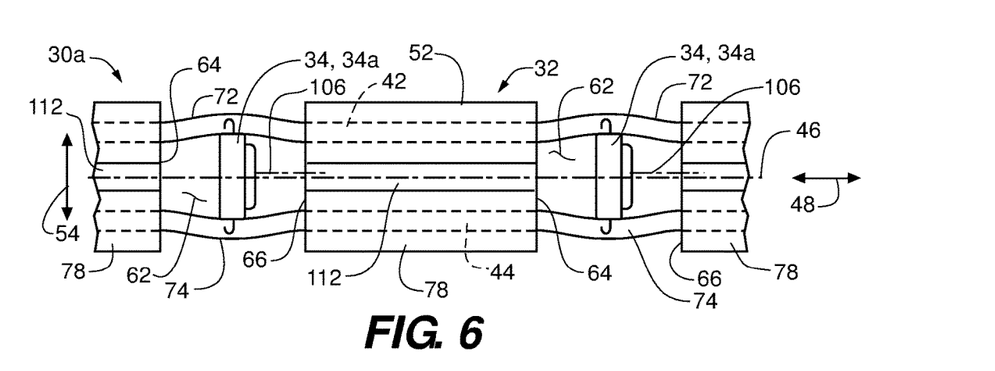
FIG. 6 is a plan view of the light string of FIG. 5.
Figure 7:
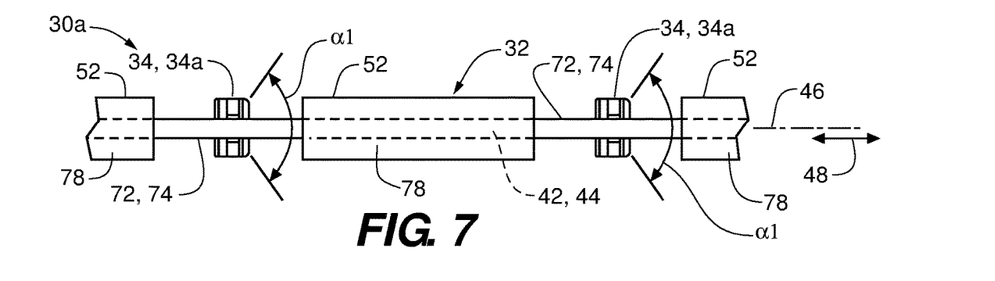
FIG. 7 is a side view of the light string of FIG. 5.

Referring to FIGS. 5 through 7, construction details of a light string 30a are presented in an embodiment of the disclosure. Herein, disclosed embodiments of the light string are referred to generically and collectively with reference character 30, while specific embodiments are referred to with the reference character 30 followed by a letter suffix (e.g., "light string 30a" of FIGS. 5 through 7). The light string 30a includes many of the same components and attributes of the light string 30, which are indicated by same-numbered reference characters. The light string 30a includes lighting assemblies 34a, which are detailed below in reference to FIGS. 8A-8G and 9. Herein, disclosed embodiments of the lighting assemblies are referred to generically and collectively with reference character 34, while specific embodiments are referred to with the reference character 34 followed by a letter suffix (e.g., "lighting assembly 34a" of FIGS. 5 through 9). As in FIGS. 1 and 2, components and features that are encased within a translucent material (i.e., within the electrical insulation 52 and pottings 36) are depicted with dashed or dotted lines.

For the light string 30a, some or all of the plurality of lighting assemblies 34 are oriented so that the illumination axes 106 is substantially aligned with the central axis 46 of the wiring assembly 32, as depicted in FIGS. 5 through 7. More generally, the illumination axes 106 are directed to illuminate one of the opposed edges 64 or 66 that define the aperture 62 in which the respective lighting assembly 34 is disposed. Also for light string 30a, the electrical insulation 52 includes a web portion 112 that extends laterally between the first electrical conductor 42 and the second electrical conductor 44, the web portion 112 defining a substantially uniform thickness 114 perpendicular to the central axis 46.

Functionally, for embodiments where the electrical insulation 52 is translucent, orienting the illumination axis 106 in substantial alignment with the central axis 46 creates a novel lighting effect. For such embodiments, a portion of the light emitted from the lighting element 100 of a given lighting assembly 62 enters the translucent electrical insulation 52 and propagates along the translucent electrical insulation 52. Some of the light that enters the translucent electrical insulation 52 subsequently exits the translucent electrical insulation 52, for example by direct propagation through the outer surface of the translucent electrical insulation 52, by scattering or refraction from within the translucent electrical insulation 52, by reflection off the electrical conductors 42 and 44, or by a combination of these mechanisms. For embodiments where the pottings 36 bridge the edges 64 and 66, transmission of light from the potting 36 into the translucent electrical insulation 52 may be augmented so that there is less reflective loss at the interface and more light enters the translucent electrical insulation 52.

In embodiments wherein electrical insulation 52 is not translucent, but rather is opaque, light transmitted through potting 36 will not penetrate electrical insulation 52, but rather, will reflect off of insulation 52, including reflecting off of edges 64 and/or 66 and web portions 114 where present to create another lighting effect that relies more on reflection than transmission through insulation 52.

Figures 8A, 8B, 8C, 8D, 9:
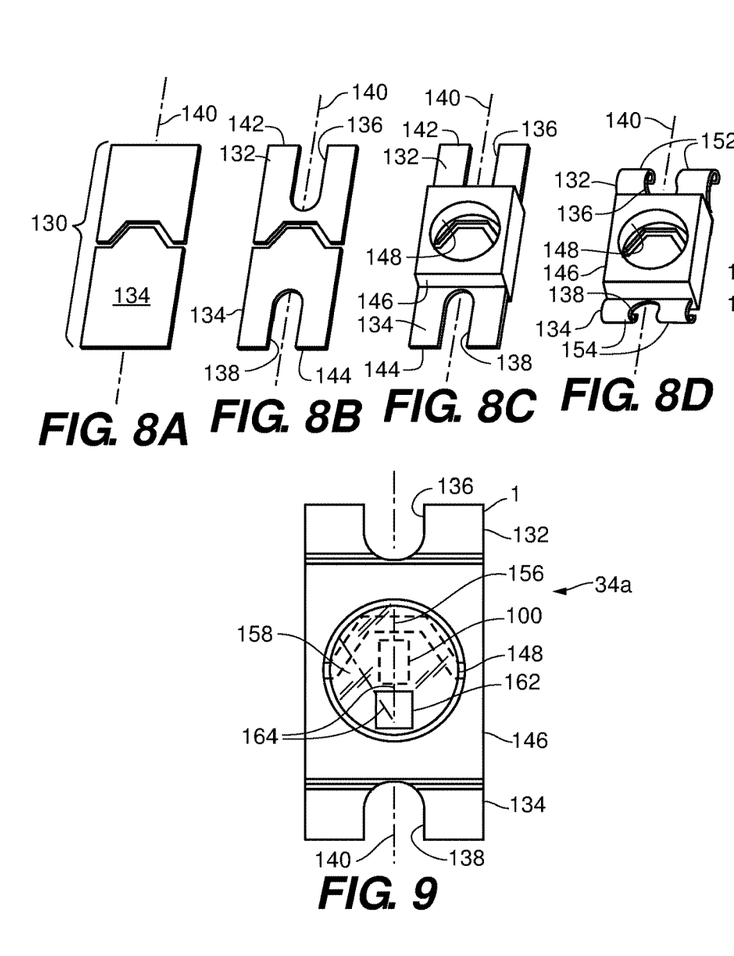
FIG. 8A is a perspective view of a lighting assembly in a step of assembly according to an embodiment of the disclosure.
FIG. 8B is a perspective view of a lighting assembly in a step of assembly according to an embodiment of the disclosure.
FIG. 8C is a perspective view of a lighting assembly in a step of assembly according to an embodiment of the disclosure.
FIG. 8D is a perspective view of a lighting assembly in a step of assembly according to an embodiment of the disclosure.
FIG. 9 is an enlarged, plan view of the completed lighting assembly of FIG. 8G.
Figure 8E:
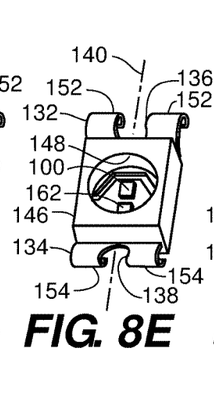
FIG. 8E is a perspective view of a lighting assembly in a step of assembly according to an embodiment of the disclosure.
Figure 8F:
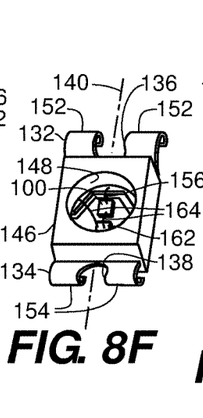
FIG. 8F is a perspective view of a lighting assembly in a step of assembly according to an embodiment of the disclosure.
Figure 8G:
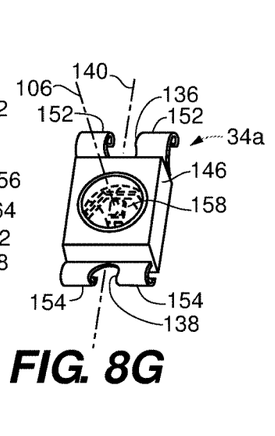
FIG. 8G is a perspective view of a lighting assembly in a step of assembly according to an embodiment of the disclosure.

Referring to FIGS. 8A through 8G, aspects of and manufacturing steps for the lighting assembly 34a are presented according to an embodiment of the disclosure. In the depicted embodiment, a substrate 130 is bifurcated into two segments 132 and 134 (FIG. 8A). Slots 136 and 138 formed at opposing ends 142 and 144 of the bifurcated substrate 130 (FIG. 8B), the slots 136 and 138 extending along a lateral axis 140. A housing 146 is affixed to the bifurcated substrate 130, with the slotted ends 142 and 144 protruding out of the housing 146, the housing defining a window 148 (FIG. 8C). The segments 132 and 134 may be formed to provide a pair of curled tabs 152 and 154 on each end 142 and 144, respectively, that are separated by the respective slot 136, 138 (FIG. 8D). The lighting element 100 (LED 102 being depicted) is affixed to the segment 132 within the housing 146 (FIG. 8E). An electrical lead 156, such as a wire, is coupled to the lighting element 100 and the segment 134 (FIG. 8F). A sealant 158 may be disposed within the housing 146 upon completion of the assembly (FIG. 8G).

Referring to FIG. 9, and again to FIGS. 8E through 8G, the lighting assembly 34a is depicted with an integrated switch 162 according to an embodiment of the disclosure. In the depicted embodiment, the integrated switch 162 is affixed and grounded to the segment 132, receiving power through the segment 132 and distributing the power via leads 164 to the light element 100 and segment 134.

Functionally, the sealant 154 acts to secure the segments 132 and 134 within and relative to the housing 146, and may also function to diffuse the light emitted by the light source 100 to produce a more uniform luminosity. In some embodiments, the window 148 effectively defines the illumination angle α1, so that the illumination axis 106 is centered within and extends normal to the window 148 (FIG. 8G). The integrated switch 162 may be a "smart" switch that is communicated with over the wiring assembly 32 for control of the luminance of the light source 100 (on, off, dimming). In an embodiment, switch 162 is a controller comprising an integrated circuit chip. In some embodiments, the integrated switch responds only to signals that follow an address protocol. In some embodiments, the slots 136 and 138 accommodate joining of the lighting assembly 34a to the opposed portions 72 and 74 of the first and second electrical conductors 42 and 44. The slots 136 and 138 may be dimensioned to provide an interference fit with each of the opposed portions 72 and 74, so that each of the curled tab pairs 152 and 154 act to pinch or clamp the respective opposed portion 72, 74.

Figure 10:
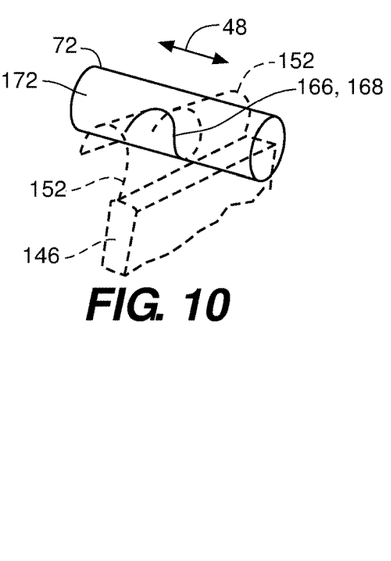
FIG. 10 is a partial view of the lighting assembly of FIG. 9 coupled to an electrical conductor, illustrating a line of contact therebetween, according to an embodiment of the disclosure.
Figure 11:
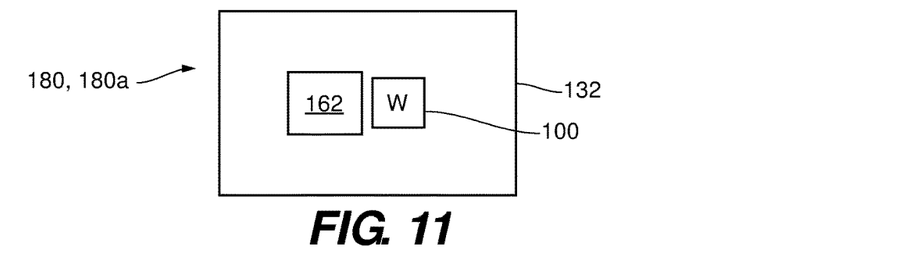
FIGS. 11 through 15 are schematic depictions of lighting arrangements for implementation in the light string of FIG. 5 through 7 according to an embodiment of the disclosure.
Figure 12:
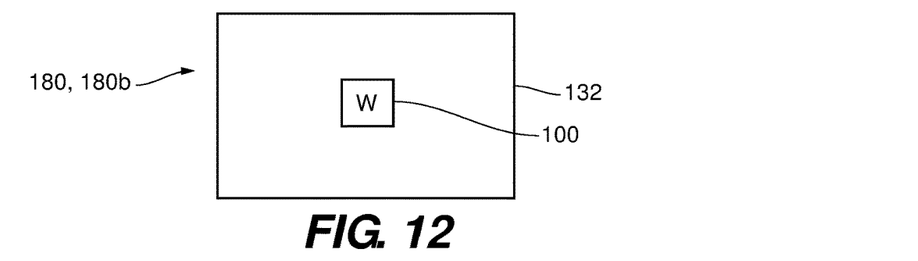

Referring to FIG. 10, the curled configuration of the curled tabs 152 and 154 provides a registration contour 166 according to an embodiment of the disclosure. For clarity, the depiction of FIG. 10 presents a contact trace line 168 of the registration contour 166 against the portion 72 with a thick line, while the curled tabs 152 that engage the contact trace line 168 and the housing 146 are depicted in phantom. The thick line of the registration contour 166 is solid on the visible side of the portion 72 and dashed on the hidden side of the portion 72. The contact trace line 168 of the registration contour 166 extends both tangentially around an outer surface 172 of the portion 72 and parallel to the axial direction 48 (i.e., parallel to the opposed portion 72 and 74). The same effect exists for the engagement of the curled tabs 154 with the opposed portion 74 (not depicted in FIG. 10).

During assembly, the registration contour 166 helps stabilize the lighting assembly 34a in an orientation where the illumination axis 106 is substantially parallel to the central axis 46 when the lighting assembly 34a is mounted to the opposed portions 72 and 74 within a respective aperture 62. By extending both tangentially and axially along the outer surfaces of the portions 72 and 74, rotation of the lighting assembly 34a about the lateral axis 140 is inhibited during the assembly process.

The substrate 130 may include a metallic sheet, for example copper or a copper alloy. In some embodiments, the electrical lead is a fine, single strand wire, for example copper or gold. The sealant 154 is of a translucent material (e.g., clear or semitransparent epoxy) to permit transmission of light emitted by the light source 100 to be transmitted through the window 148.

Coupling of the lighting assembly 34a to the opposed portions 72 and 74 of the conductors 42 and 44 can be made in several ways. Traditional soldering or tack welding of the curled tabs 152 and 154 to the opposed portions 72 and 74 is one option. Bonding with a conductive material is another option, such as disclosed by U.S. Pat. No. 7,926,978 to Tsai, the disclosure of which is incorporated by reference herein except for express definitions contained therein. In some embodiments, the interference fit between the curled tabs 152 and 154 to the opposed portions 72 and 74 is sufficient for electrical conduction, with the lighting assembly 34a being held in fixed electrical contact by the potting 36.

Referring to FIGS. 11 through 15, schematic representations of lighting arrangements 180 for the light source 100 or a plurality of light sources is depicted according to an embodiment of the disclosure. The arrangements are referred to generically and collectively with reference character 180, while specific embodiments are referred to with the reference character 180 followed by a letter suffix (e.g., "lighting arrangement 180a" of FIG. 11). The lighting arrangement 180a schematically represents the same lighting arrangement as depicted in FIG. 9, with the integrated switch 162 and the light source 100 configured to emit a white light, designated by the letter W. Lighting arrangement 180b is a simplified version of the lighting arrangement 180b, with the light source 100 directly coupled to the segment 132 for direct energization without an intermediate switch. The term "lighting assembly" may also be used to refer to "lighting arrangement."

Figure 13:
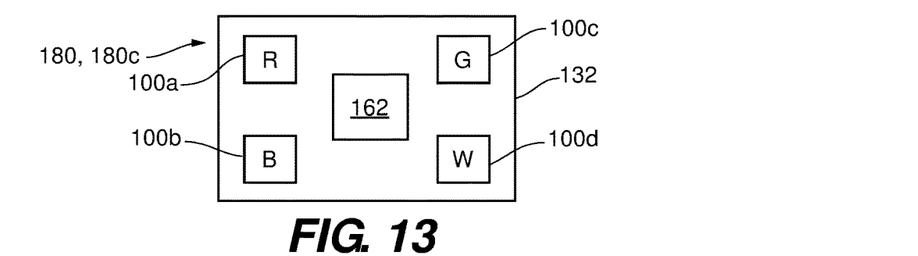
Figure 14:
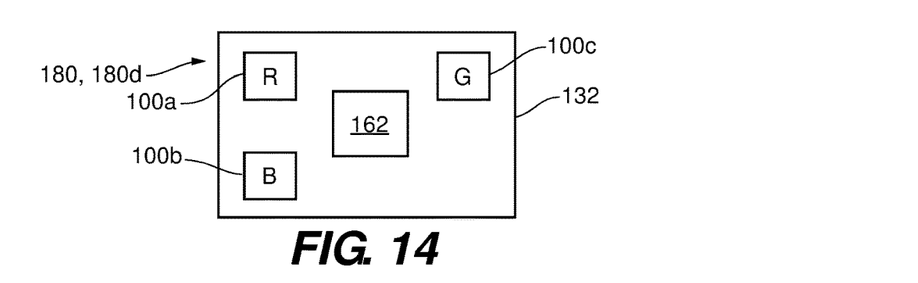
Figure 15:
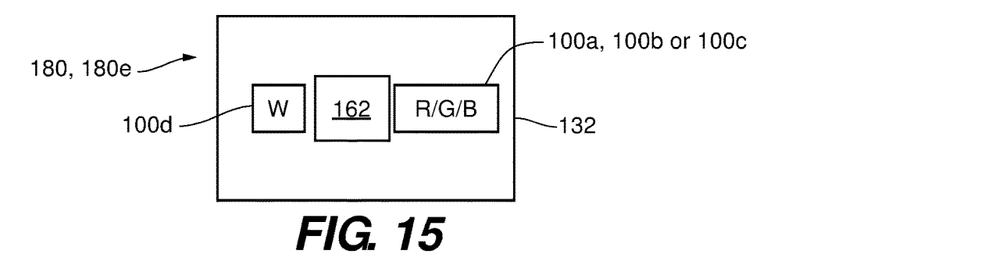

Lighting arrangement 180c includes a plurality of light sources 100a through 100d that are controlled by the integrated switch 162. In the depiction of lighting arrangement 180c, light source 100a emits a red light (denoted by the letter R), light source 100b emits a blue light (denoted by the letter B), light source 100c emits a green light (denoted by the letter G), and light source 100d emits a white light (denoted by the letter W). The integrated switch 162 controls the distribution and timing of power to the light sources 100a through 100d, and may be configured to light any number of the light sources 100a through 100d that may power each light source 100a-100d in accordance with timing schedules that are independent of each other, as determined by addressed signals received across the wiring assembly 32. Lighting arrangement 180d is similar to lighting arrangement 180c, the distinction being that it includes only light sources 100a through 100c (i.e., no white light emitter). Lighting arrangement 180e includes only two lights that are controlled by the integrated switch: light source 100d, emitting a white light, and one of light sources 100a, 100b, or 100c, emitting one of the colors red, blue, or green.

In an embodiment, light sources 100a through 100d comprise LEDs that emit the same wavelength of light, i.e., emit the same color light, rather than different colors as described in some of the embodiments above. In one such embodiment, all LEDs are powered at the same time, thus increasing the overall brightness of the LED arrangement 180, as compared to a single-chip LED LED arrangement. In an embodiment, the number of LED chips is two or more. In one such embodiment, the number of LEDs ranges from two to six; in an embodiment, the number of LEDs is two or four. In other embodiments, only one or fewer than all LED chips of the LED arrangement may be powered at the same time and controlled by control switch 162.

Figure 16:
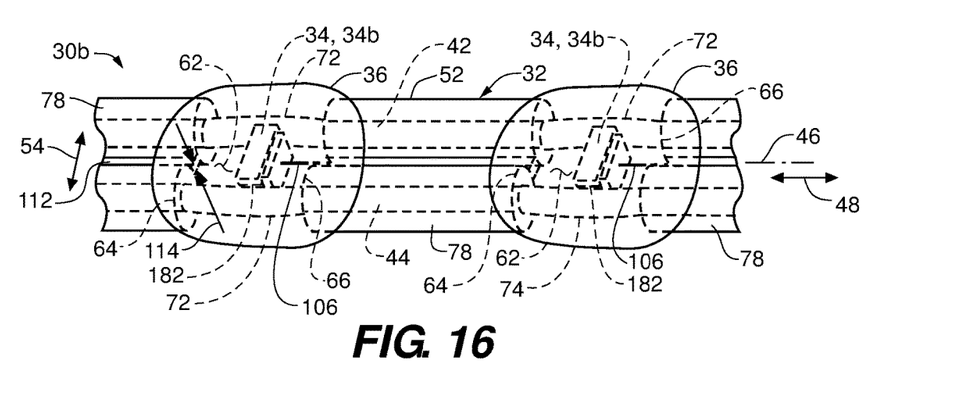
FIG. 16 is a partial perspective view of a light string according to an embodiment of the disclosure.
Figure 17:
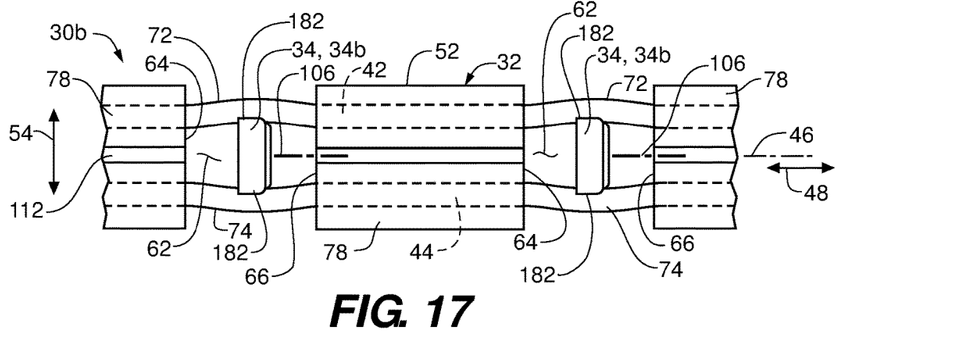
FIG. 17 is a plan view of the light string of FIG. 16.
Figure 18:
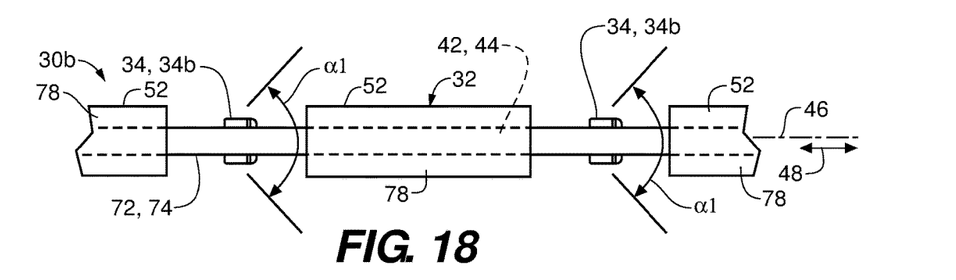
FIG. 18 is a side view of the light string of FIG. 16.
Figure 19:
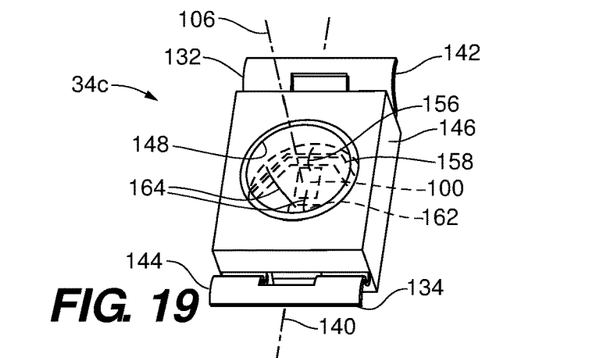
FIG. 19 is a perspective view of a lighting assembly according to an embodiment of the disclosure.

Referring to FIGS. 16 through 18, a wiring assembly 30b is depicted according to an embodiment of the disclosure. The wiring assembly 30b includes many of the same components and attributes as the wiring assembly 30a, which are indicated with the same reference characters. A difference between the wiring assemblies 30a and 30b is that wiring assembly 30b utilizes a lighting assembly 34b that does not include tab portions that extend from the housing 146. Instead, the segments 132 and 134 are terminated at pads 182 that provide a mounting surface that extends substantially parallel to the illumination axis 106. These pads may be electrically connected using traditional soldering or tack welding of the pads 182 to the opposed portions 72 and 74, or by bonding with a conductive material. Otherwise, the lighting assemblies 34b are oriented the same as lighting assemblies 34a, to produce a lighting effect that is the same as for wiring assembly 30a. Referring to FIG. 19, a lighting assembly 34c is depicted according to an embodiment of the disclosure. The lighting assembly 34c includes many of the same components and attributes as the lighting assembly 34a, which are indicated with the same reference characters. A difference between the lighting assemblies 34a and 34c is that, for the lighting assembly 34c, the ends 142 and 144 of the segments 132 and 134, respectively, are radiused to conform to the tangential surfaces of the opposed portions 72 and 74 in the axial direction 48. Also, the radiused segments 132 and 134 may each have a closed slot 184 formed therein.

Figure 20:
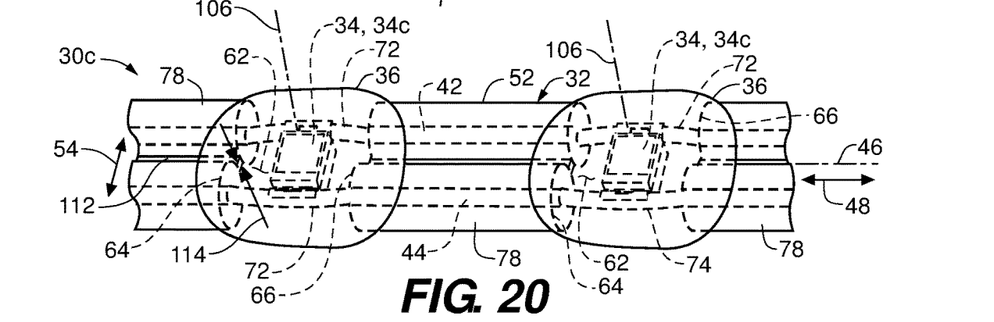
FIG. 20 is a partial perspective view of a light string according to an embodiment of the disclosure.
Figure 21:
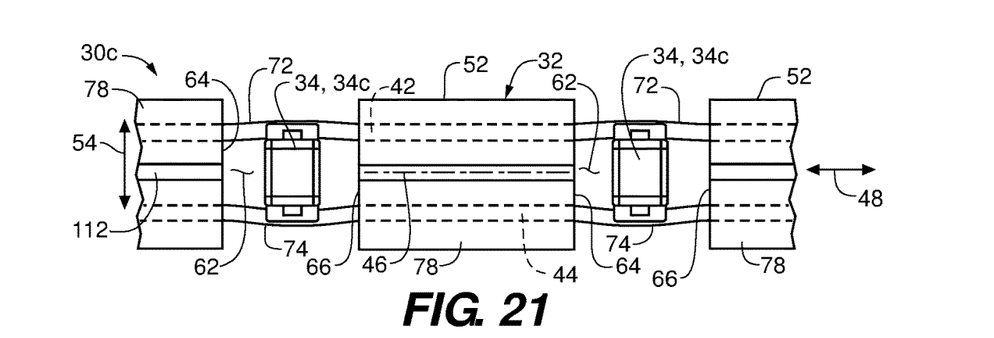
FIG. 21 is a plan view of the light string of FIG. 20.
Figure 22:
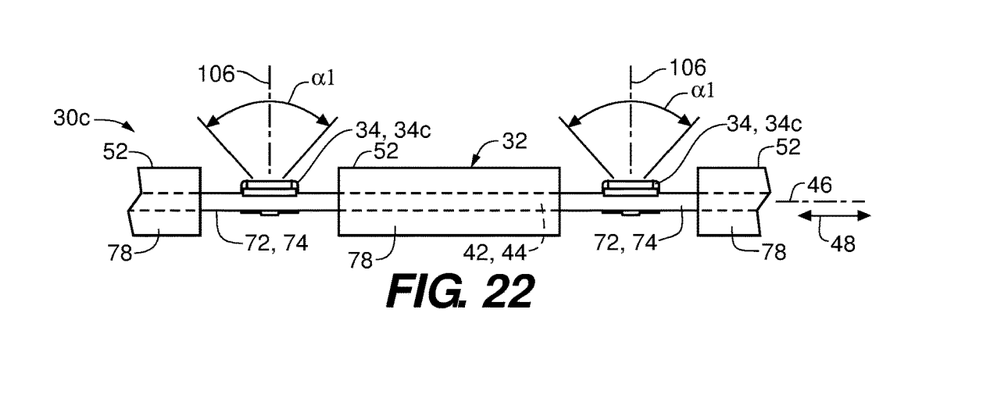
FIG. 22 is a side view of the light string of FIG. 20.

Referring to FIGS. 20 through 22, a wiring assembly 30c is depicted according to an embodiment of the disclosure. The wiring assembly 30c includes many of the same components and attributes as the wiring assembly 30a, which are indicated with the same reference characters. A difference between the wiring assemblies 30a and 30c is that wiring assembly 30c utilizes the lighting assemblies 34c. The radiused segments 132 and 134 are mounted to and extend parallel to the opposed portions 72 and 74, so that the illumination axis 106 projects perpendicular to the lateral and axial directions 54 and 48. Accordingly, the edges 64 and 66 are not in direct line with the illumination axis, thus causing a different lighting effect.

Figure 23:
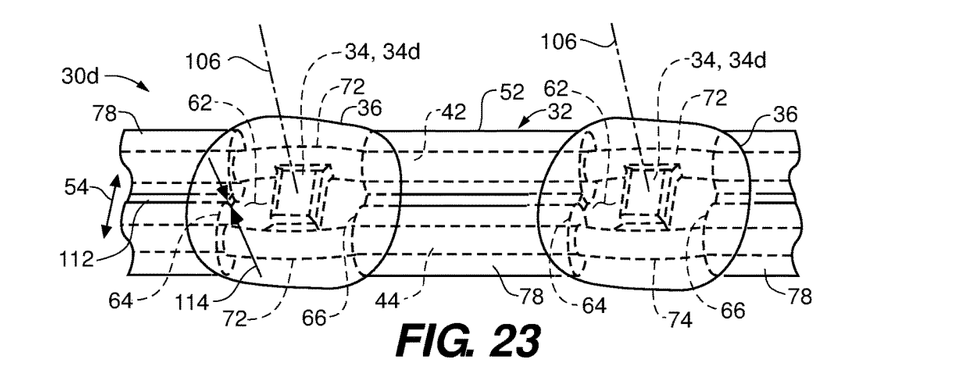
FIG. 23 is a partial perspective view of a light string according to an embodiment of the disclosure.
Figure 24:
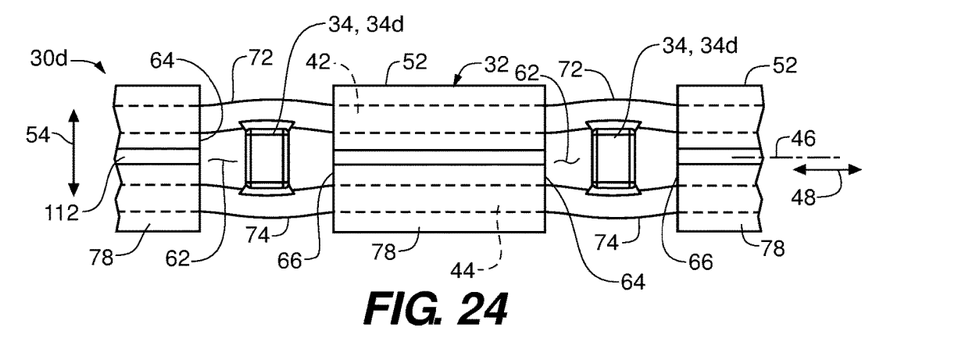
FIG. 24 is a plan view of the light string of FIG. 23.
Figure 25:
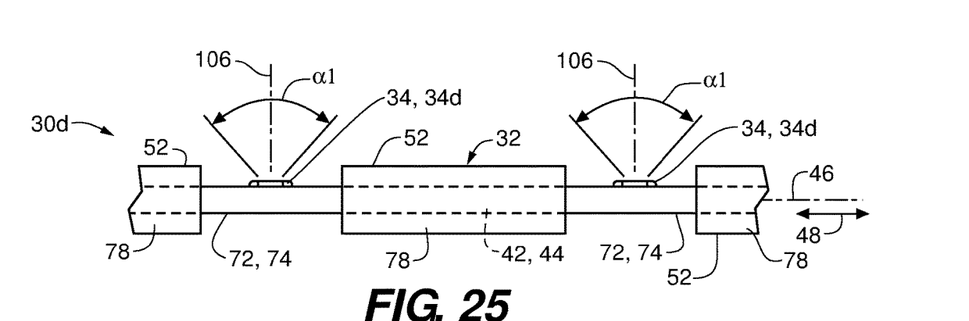
FIG. 25 is a side view of the light string of FIG. 23.

Referring to FIGS. 23 through 25, a wiring assembly 30d is depicted according to an embodiment of the disclosure. The wiring assembly 30d includes many of the same components and attributes as the wiring assembly 30c, which are indicated with the same reference characters. A difference between the wiring assemblies 30c and 30d is that wiring assembly 30d utilizes a lighting assembly 34d that does not include radiused segments 132 and 134 that extend from the housing 146. Instead, the segments 132 and 134 are terminated at pads 182 that provide a mounting surface that extends substantially parallel to the illumination axis 106, akin to lighting assembly 34b. These pads may be electrically connected using traditional soldering or tack welding of the pads 182 to the opposed portions 72 and 74, or by bonding with a conductive material. Otherwise, the lighting assemblies 34d are oriented the same as lighting assemblies 34c, to produce a lighting effect that is the same as for wiring assembly 30c.

Each of the additional figures and methods disclosed herein can be used separately, or in conjunction with other features and methods, to provide improved devices and methods for making and using the same. Therefore, combinations of features and methods disclosed herein may not be necessary to practice the disclosure in its broadest sense and are instead disclosed merely to particularly describe representative and preferred embodiments.

Various modifications to the embodiments may be apparent to one of skill in the art upon reading this disclosure. For example, persons of ordinary skill in the relevant arts will recognize that the various features described for the different embodiments can be suitably combined, un-combined, and re-combined with other features, alone, or in different combinations. Likewise, the various features described above should all be regarded as example embodiments, rather than limitations to the scope or spirit of the disclosure.

Persons of ordinary skill in the relevant arts will recognize that various embodiments can comprise fewer features than illustrated in any individual embodiment described above. The embodiments described herein are not meant to be an exhaustive presentation of the ways in which the various features may be combined. Accordingly, the embodiments are not mutually exclusive combinations of features; rather, the claims can comprise a combination of different individual features selected from different individual embodiments, as understood by persons of ordinary skill in the art.

Unless indicated otherwise, references to "embodiment(s)", "disclosure", "present disclosure", "embodiment(s) of the disclosure", "disclosed embodiment(s)", and the like contained herein refer to the specification (text, including the claims, and figures) of this patent application that are not admitted prior art.

For purposes of interpreting the claims, it is expressly intended that the provisions of 35 U.S.C. 112(f) are not to be invoked unless the specific terms "means for" or "step for" are recited in the respective claim.

What is claimed is:
1. A decorative light string, comprising:
   a wiring assembly including:
      a first electrical conductor;
      a second electrical conductor that extends substantially parallel to the first electrical conductor, the first electrical conductor and the second electrical conductor being separated and on opposing sides of a central axis that extends in an axial direction;
      electrical insulation that extends along the central axis and encases portions of the first electrical conductor and the second electrical conductor, the electrical insulation separating the first electrical conductor from the second electrical conductor in a lateral direction about the central axis, the electrical insulation including a web portion that extends laterally and axially between the first electrical conductor and the second electrical conductor; and
      a plurality of apertures formed along an axial length of the electrical insulation, each one of the plurality of apertures being defined in the axial direction by opposed edges of the electrical insulation and being defined in the lateral direction by opposed portions of the first single electrical conductor and the second single electrical conductor;
   a plurality of lighting assemblies, each defining an illumination axis about which a luminosity profile is centered when energized, each of the plurality of lighting assemblies being disposed within a respective one of the plurality of apertures, and each being attached to and in electrical communication with the first electrical conductor and the second electrical conductor at the respective one of the plurality of apertures, each of the plurality of lighting assemblies extending across the central axis in the lateral direction; and a plurality of pottings, each encasing a respective one of the plurality of apertures and an associated one of the plurality of lighting assemblies disposed therein, each of the plurality of pottings bridging the opposed edges of the electrical insulation and the opposed portions of the first electrical conductor and the second electrical conductor, wherein each of the plurality of lighting assemblies are oriented so that the illumination axis illuminates one of the opposed edges of the electrical insulation, wherein the plurality of pottings are translucent, and wherein the web portion extending between the first electrical conductor and the second electrical conductor is continuous between first and second apertures of the plurality of apertures.

2. The decorative light string of claim 1, wherein the web portion defines a substantially uniform thickness perpendicular to the central axis.

3. The decorative light string of claim 1, wherein the plurality of pottings includes an epoxy material.

4. The decorative light string of claim 1, wherein the electrical insulation includes poly vinyl chloride.

5. The decorative light string of claim 1, wherein each of the plurality of lighting assemblies includes a light emitting diode.

6. The decorative light string of claim 5, wherein each of the plurality of lighting assemblies includes a control switch configured to control the light emitting diode.

7. The decorative light string of claim 6, wherein each of the plurality of lighting assemblies includes a housing that houses the control switch and the light emitting diode.

8. The decorative light string of claim 1, wherein the potting comprises a translucent material.

9. The artificial tree of claim 1, wherein at least one of the plurality of lighting assemblies includes a plurality of LEDs.

10. The artificial tree of claim 9, wherein the plurality of LEDs comprise LEDs that emit light of the same color.

11. The decorative light string of claim 1, wherein the first electrical conductor and the second electrical conductor include copper and each have a diameter that is within a range of 0.3 mm to 0.45 mm inclusive.

12. The decorative light string of claim 1, wherein the plurality of apertures define a plurality of discontinuous insulation segments.

13. The decorative light string of claim 1, wherein the illumination axis is substantially aligned along the central axis.

14. The decorative light string of claim 1, wherein the electrical insulation is translucent.

15. The decorative light string of claim 14, wherein each of the plurality of LED assemblies are electrically connected to each other in parallel.

16. An artificial tree including the light string according to claim 1.

17. A decorative light string, comprising:
a wiring assembly including:
  a first electrical conductor;
  a second electrical conductor that extends substantially parallel to said first electrical conductor, the first electrical conductor and the second electrical conductor being separated and on opposing sides of a central axis that extends in an axial direction;
  electrical insulation comprising a plurality of unconnected segments of electrical insulation comprised of polyvinyl chloride, each segment extending along said central axis and encasing portions of said first electrical conductor and said second single electrical conductor, each segment including a web portion that extends laterally and axially between the first electrical conductor and the second electrical conductor in a continuous manner; and
a plurality of light-emitting diode (LED) assemblies encapsulated by a translucent material, each LED assembly including a housing defining a first side, a second side that is opposite to the first side, and a top side, an LED mounted to the housing, each LED assembly electrically connected to, and mechanically in between, the first conductor and the second conductor so as to exert a lateral force on the first and second conductors thereby causing the first conductor to bend laterally in a first direction transverse to the central axis and causing the second conductor to bend laterally in a second direction transverse to the central axis.

18. The decorative light string of claim 17, wherein the LED is mounted to the top side of the housing, and the LED assembly is electrically connected to the first conductor at an electrical terminal at the first side of the housing and is electrically connected to the second conductor at an electrical terminal at the second side of the housing.

19. The decorative light string of claim 17, wherein a plurality of apertures are formed along an axial length of the electrical insulation, each one of the plurality of apertures being defined in the axial direction by opposed edges of the electrical insulation and being defined in the lateral direction by opposed portions of the first electrical conductor and the second single electrical conductor, and located between segments of the electrical insulation.

20. The decorative light string of claim 17, wherein each of the plurality of lighting assemblies are oriented so that illumination from the LED assembly is directed to one of the opposed edges of the electrical insulation.

21. The decorative light string of claim 17, wherein the electrical insulation is translucent.

22. The decorative light string of claim 17, wherein the first electrical conductor comprises a multi-strand conductor.

23. The artificial tree of claim 17, wherein at least one of the plurality of LED assemblies includes a plurality of LEDs.

24. The artificial tree of claim 23, wherein the plurality of LEDs comprise LEDs that emit light of the same color.

25. An artificial tree comprising the decorative light string of claim 17.

* * * * *

UNITED STATES PATENT AND TRADEMARK OFFICE
CERTIFICATE OF CORRECTION

Page 1 of 1

PATENT NO. : 10,288,235 B1
APPLICATION NO. : 15/911809
DATED : May 14, 2019
INVENTOR(S) : Johnny Chen It is certified that error appears in the above-identified patent and that said Letters Patent is hereby corrected as shown below:

In the Specification

Column 4, Line 24, delete "poly vinyl" and insert -- polyvinyl --, therefor.

In the Claims

Column 11, Line 38, Claim 9 delete "artificial tree" and insert -- decorative light string --, therefor.

Column 11, Line 40, Claim 10 delete "artificial tree" and insert -- decorative light string --, therefor.

Signed and Sealed this
Twentieth Day of August, 2019

Andrei Iancu
*Director of the United States Patent and Trademark Office*